(12) United States Patent
Worley, Sr. et al.

(10) Patent No.: US 6,646,491 B2
(45) Date of Patent: Nov. 11, 2003

(54) LED LAMP PACKAGE FOR PACKAGING AN LED DRIVER WITH AN LED

(76) Inventors: Eugene Robert Worley, Sr., 11 Bowditch, Irvine, CA (US) 92620; Eugene R. Worley, Jr., 11 Bowditch, Irvine, CA (US) 92620

( * ) Notice: Subject to any disclaimer, the term of this patent is extended or adjusted under 35 U.S.C. 154(b) by 0 days.

(21) Appl. No.: 10/233,856

(22) Filed: Sep. 3, 2002

(65) Prior Publication Data

US 2003/0001657 A1 Jan. 2, 2003

Related U.S. Application Data

(63) Continuation-in-part of application No. 09/859,310, filed on May 18, 2001, now Pat. No. 6,486,726.

(51) Int. Cl.[7] .......................... H01L 31/00; H03K 17/78
(52) U.S. Cl. .................................................... 327/514
(58) Field of Search ................................. 327/514, 515, 327/502–506, 584, 585; 257/82, 99, 100, 676

(56) References Cited

U.S. PATENT DOCUMENTS

| 6,054,716 A | * | 4/2000 | Sonobe et al. ............. 250/552 |
| 6,091,084 A | * | 7/2000 | Fujii .............................. 257/82 |
| 6,407,411 B1 | * | 6/2002 | Wojnarowski et al. ........ 257/99 |
| 6,521,916 B2 | * | 2/2003 | Roberts et al. ............. 257/100 |

* cited by examiner

*Primary Examiner*—My-Trang Nu Ton

(57) ABSTRACT

An LED lamp package for packaging an LED driver with an LED is provided. In one embodiment, the LED lamp package includes an LED driver chip and an LED chip, both of which are mounted on the ground lead of the LED lamp package and both of which are enclosed by the light transparent encapsulant of the LED lamp package. In another embodiment, the LED chip is mounted on top of the LED driver chip in the LED lamp package. In this embodiment, the LED driver chip includes an attachment pad, on which the bottom surface of the LED chip is mounted.

15 Claims, 11 Drawing Sheets

LED LAMP PACKAGE FOR PACKAGING AN LED DRIVER WITH AN LED

This is a continuation-in-part of application Ser. No. 09/859,310, filed on May 18, 2001, titled "Led Driver Circuit With a Boosted Voltage Output", and now U.S. Pat. No. 6,486,726.

BACKGROUND OF THE INVENTION

1. Field of the Invention

The field of the invention is Light Emitting Diode (LED) lamp packages, and more particularly, LED lamp packages for packaging an LED driver with a LED.

2. Description of the Related Art

LEDs are commonly used as status indicator lights and in numerical and alphanumerical displays.

FIG. 1 shows a cross-sectional view of a conventional LED lamp package for packaging an LED chip 105, on which an LED is fabricated. The LED chip 105 is typically placed in a reflector cavity 110 for reflecting light emitted from the sides of the LED chip 105 upwards. The LED package includes two contact leads 112,117, one of which is connected to the reflector cavity 110, and the other of which is connected to a top contact 120 on the LED chip 105 by a bond wire 125. The top portions of the leads 112,117 and the LED chip 105 are enclosed by a light transparent encapsulant 130. The encapsulant 130 is used to hold the leads 112,117 in place and to increase the light transmission out of the LED chip 105.

The LED in the LED lamp package is typically driven by an external LED driver. The LED driver drives a current to the LED according to the specifications of the LED and lighting requirements.

SUMMARY OF THE INVENTION

Embodiments of the present invention provide LED lamp packages for packaging an LED driver circuit with an LED.

An LED lamp package according to one embodiment includes a ground lead, an control input lead, and a voltage supply lead, wherein the ground lead includes a reflector dish. The LED lamp package further includes an LED driver chip comprising an LED driver circuit and an LED chip comprising an LED. Both the LED driver chip and the LED chip are mounted on the reflector dish of the ground lead. The voltage supply lead is connected to the LED driver chip by a first bond wire, the input lead is connected to the LED driver chip by a second bond wire, and the LED driver chip is connected to the LED chip by a third bond wire. The top portions of the leads are enclosed by a light transparent encapsulant.

In another embodiment, the control input lead is omitted. In this embodiment, the LED driver circuit on the LED driver chip is configured to automatically turn on when a sufficiently high voltage power supply is applied to the LED driver circuit.

In another embodiment, the LED chip is mounted on top of the LED driver chip in the LED lamp package. In this embodiment, the LED driver chip includes an attachment pad, on which the bottom surface of the LED chip is attached.

An advantage of the LED lamp packages according to the invention is that they allow a systems manufacturer to conveniently plug the LED lamp packages into systems for lighting applications without having to provide separate LED drivers to drive the LEDs in the LED lamp packages.

Other objects and features of the present invention will become apparent from consideration of the following description taken in conjunction with the accompanying drawings.

BREIF DESCRIPTION OF THE DRAWINGS

It to be understood that the components shown in the following figures are not necessarily to scale, with emphasis instead being placed upon illustrating the principles of the invention.

DETAILED DESCRIPTION OF THE PREFFERED EMBODIMENTS

The following is provided to enable any person skilled in the art to make and use the invention and sets forth the best modes contemplated by the inventors of carrying out their invention.

Figure 1:
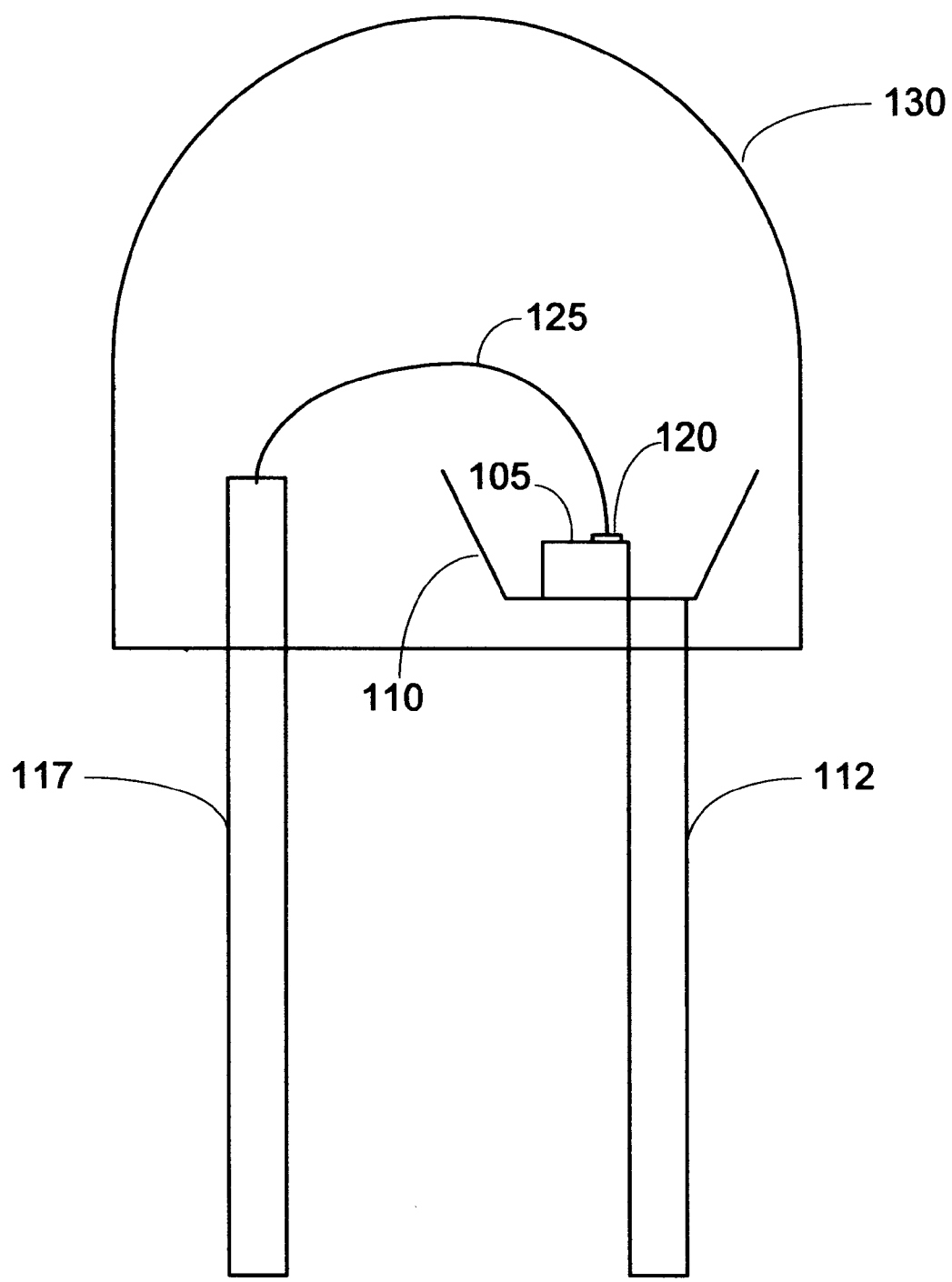
FIG. 1 shows a cross-sectional view of a conventional LED lamp package.
Figure 2A:
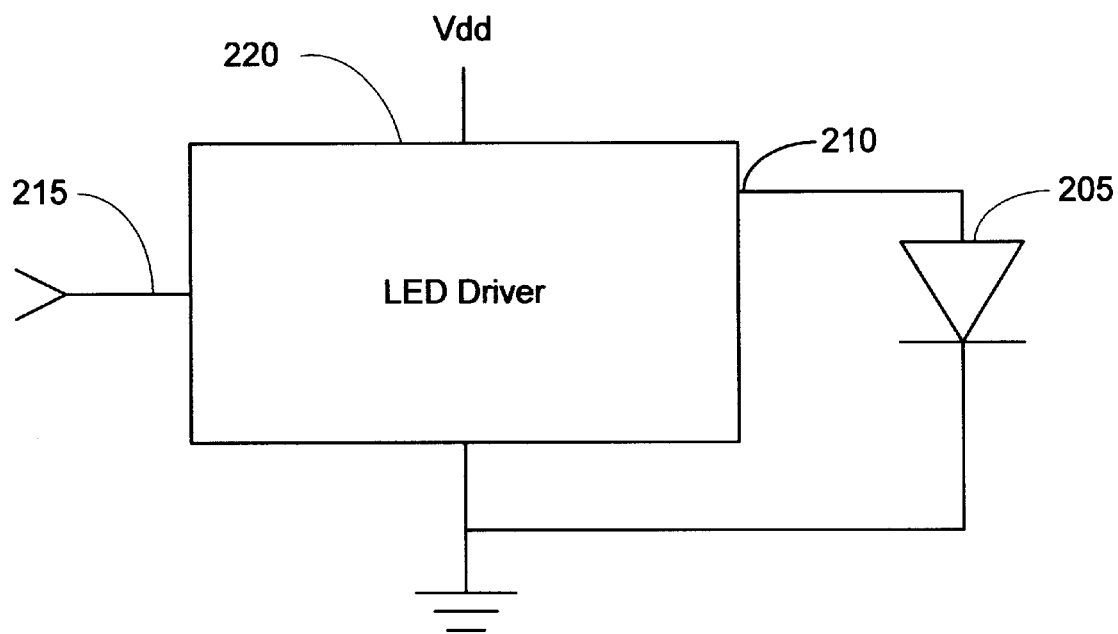
FIGS. 2A to 2C show three configurations for connecting an LED driver to an LED.
Figure 2B:
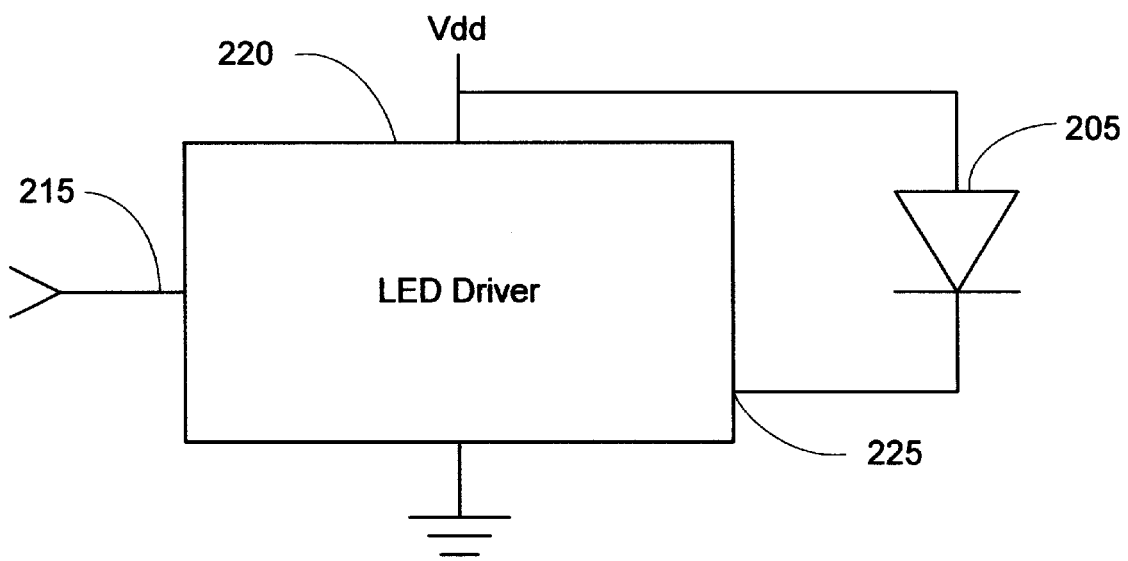
Figure 2C:
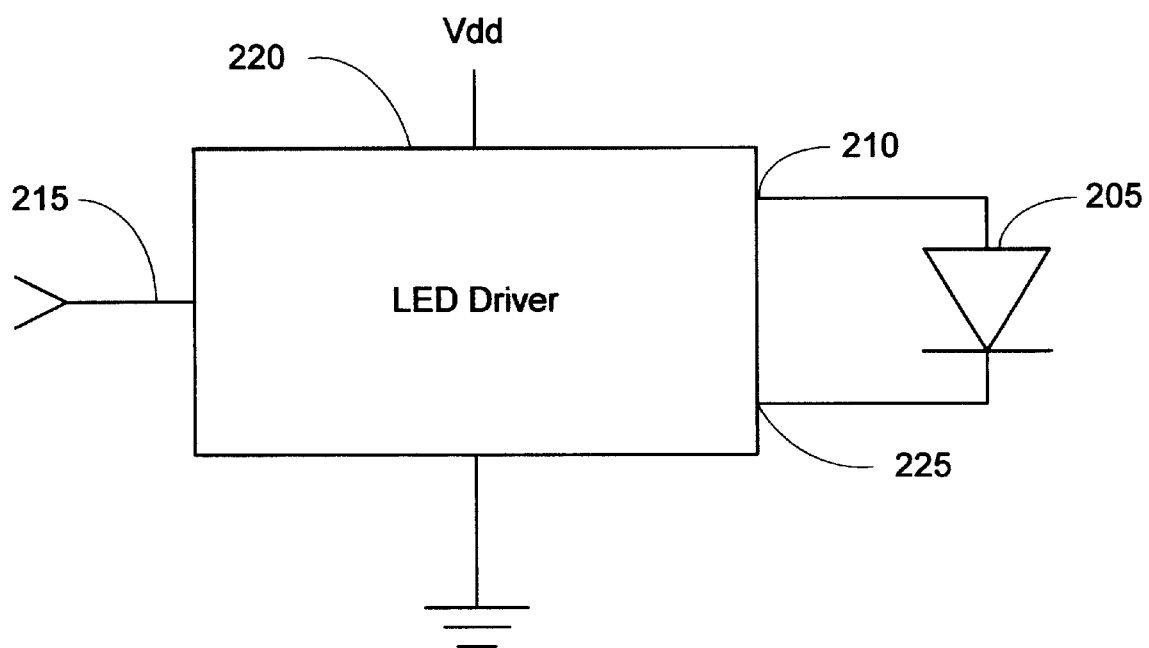

FIGS. 2A to 2C show three configurations for connecting an LED driver 220 to an LED 205. In each configuration, the LED driver 220 is connected to a voltage power supply, Vdd, and ground. In the first configuration shown in FIG. 2A, the LED driver 220 has an anode output 210 connected to the anode of the LED 205. The cathode of the LED 205 is connected to ground. In the second configuration shown in FIG. 2B, the LED driver 220 has a cathode output 225 connected to the cathode of the LED 205. The anode of the LED 205 is connected to the voltage power supply, Vdd. In the third configuration shown in FIG. 2C, the LED driver has an anode output 210 connected to the anode of the LED 205 and a cathode output 225 connected to the cathode of the LED 205.

In each configuration, the LED driver 220 includes a control input 215 for receiving a control signal. The LED driver 220 switches the LED 205 on or off based on the received control signal. The control signal may be a logic signal, and the LED driver 220 may switch the LED 205 on and off based on the logic value of the logic signal. Although one control input 215 is shown, the LED driver 220 may have more than one control input.

When the LED 205 is switched on, the LED driver 220 controls the current level supplied to the LED 205. The LED driver 220 may control the current level using a resistor (not shown) connected in series with the LED 205, as is well known in the art. The resistance value of the resistor may be chosen based on the voltage of the voltage power supply, Vdd, the voltage required to turn on the LED 205, and the desired current level. Alternatively, the LED driver 220 may control the current level using a current mirror (not shown) that sets the current level supplied to the LED 205 based on an internal reference current. Several examples of LED drivers using current mirrors can be found in the parent application Ser. No. 09/859,310, filed on May 18, 2001, titled "Led Driver Circuit With a Boosted Voltage Output", the specification of which is fully incorporated herein by reference.

Preferably, the LED driver 220 is integrated on a semiconductor chip, such as a silicon chip. The LED driver 220 may be fabricated on the chip using a CMOS process, a Bipolar process or a Bi-CMOS process. For the case in which the LED driver 220 uses a resistor to control the current level supplied to the LED 205, the resistor may be integrated on the chip using a polysilicon resistor, an N-well resistor, an N+ diffusion resistor, a P+ diffusion resistor or the like.

Figure 3A:
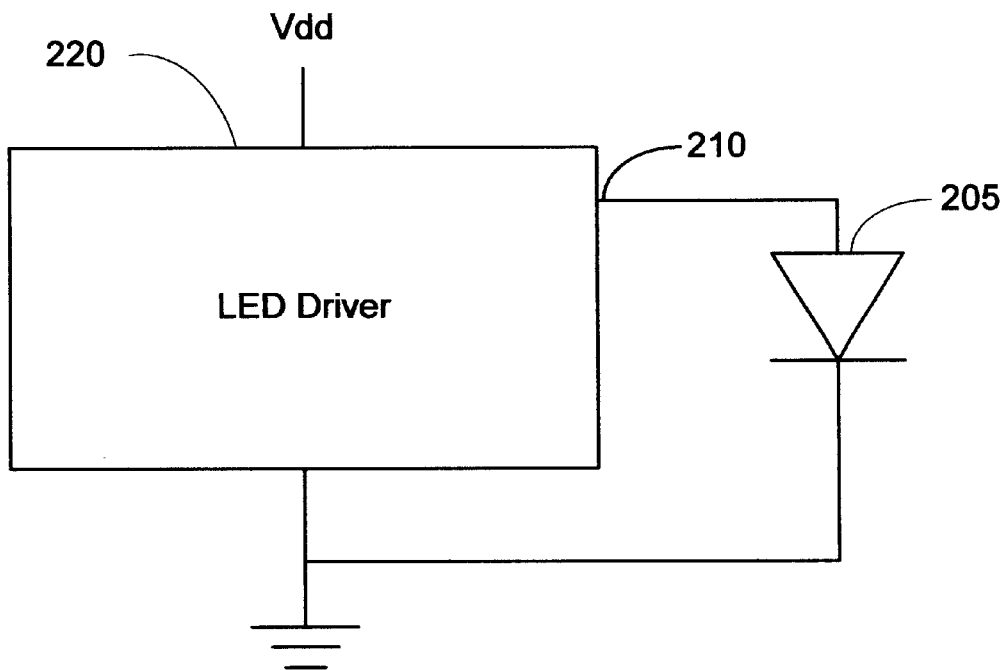
FIGS. 3A to 3C show the configurations of FIGS. 2A to 2C, respectively, in which the control input of the LED driver is omitted.
Figure 3B:
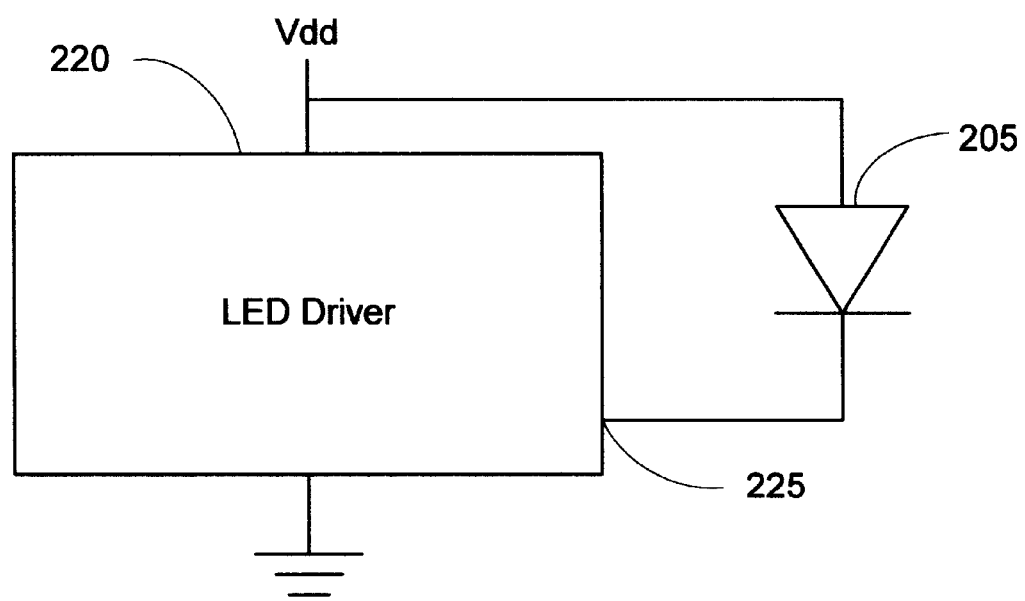
Figure 3C:
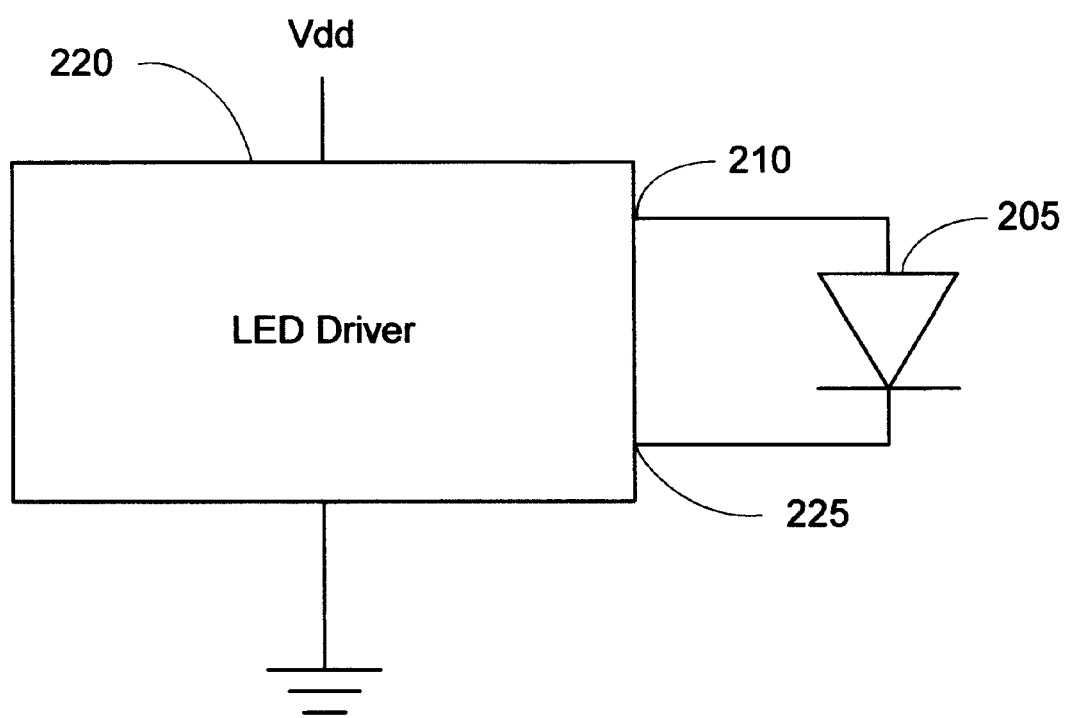

The control input 215 may be omitted for applications that do not require control of the LED driver 220. In this case, the LED driver 220 may automatically switch on the LED 205 when the voltage power supply, Vdd, applies a sufficient voltage to the LED driver 220. The sufficient voltage may be the minimum voltage required by the LED driver 220 to drive the LED 205. FIGS. 3A to 3C show the configurations of 2A to 2C, respectfully, in which the control input 215 is omitted from the LED driver 220.

Figure 4A:
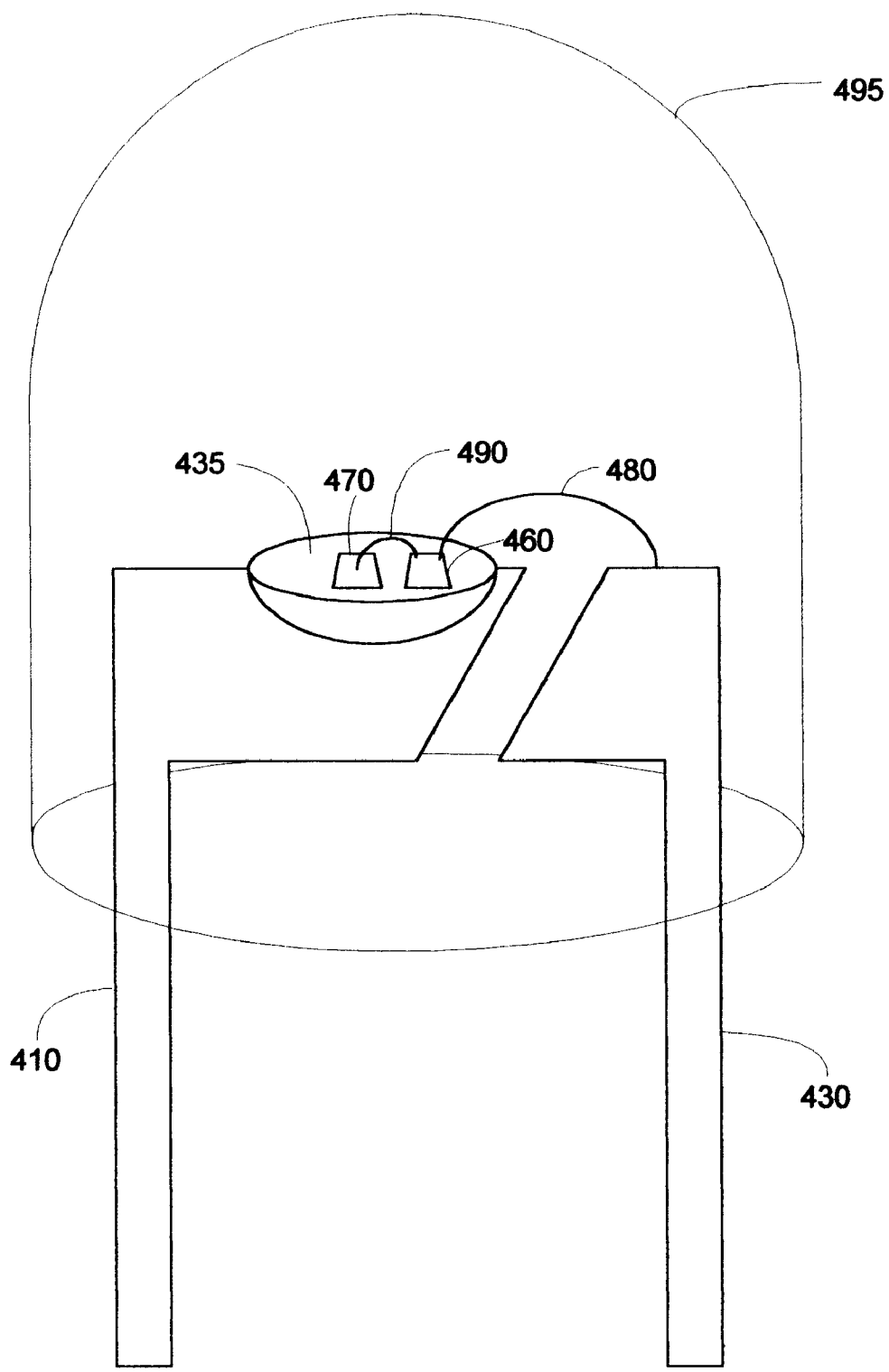
FIGS. 4A and 4B show a perspective view and a blown-up view of an LED lamp package according to an embodiment of the present invention.
Figure 4B:
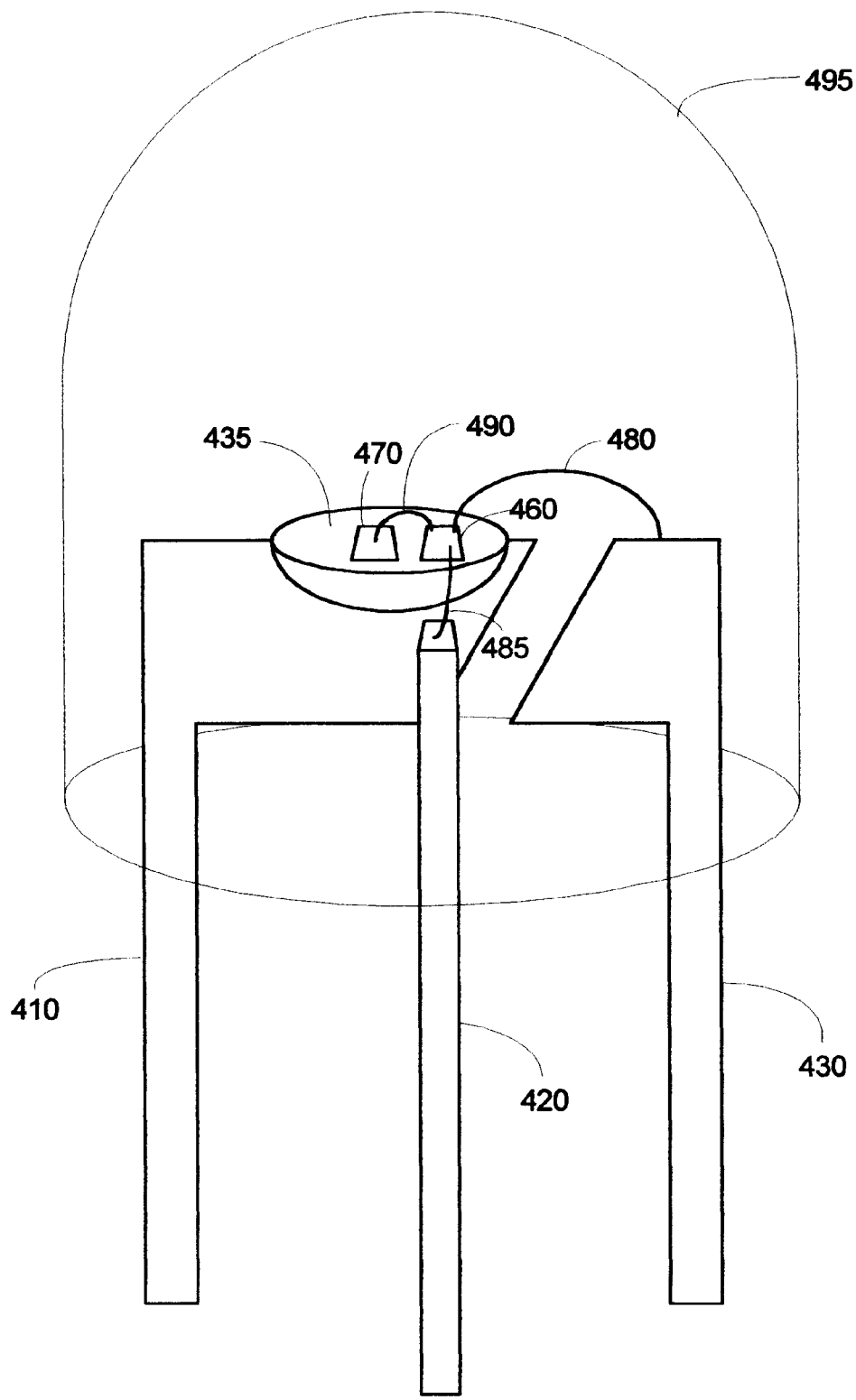

FIGS. 4A and 4B show a perspective view and a blown-up view, respectively, of an LED lamp package 405 according to an embodiment of the present invention. The LED lamp package includes a ground lead 410, a control input lead 420, and a voltage supply lead 430. The leads may be made of metal, such as aluminum. The ground lead 410 includes a reflector dish 435, which may be pressed into the ground lead 410. The LED lamp package according to this embodiment is suitable for packaging an LED driver and an LED connected in the configuration shown in FIG. 2A.

The LED lamp package also includes an LED driver chip 460, on which an LED driver circuit 220 is fabricated, and an LED chip 470, on which an LED 205 is fabricated. In this embodiment, the bottom surface of the LED chip 470 is connected to the cathode of the LED 205. Both the LED driver chip 450 and the LED chip 470 are mounted on the reflector dish 435 of the ground lead 410. Preferably, the substrate of each of the chips 460, 470 is electrically coupled to the ground lead 410. This may be done, for example, by affixing the bottom surface of each of the chips 460, 470 to the reflector dish 435 with an electrically conductive paste, such as a silver paste or a conductive epoxy. The ground lead 410 provides a ground connection for the LED driver chip 460 and the LED chip 470. Although the LED driver chip 460 is shown inside the reflector dish 435, the LED driver chip 460 may also be mounted on the side of the ground lead 410, outside of the reflector dish 435.

Figure 5A:
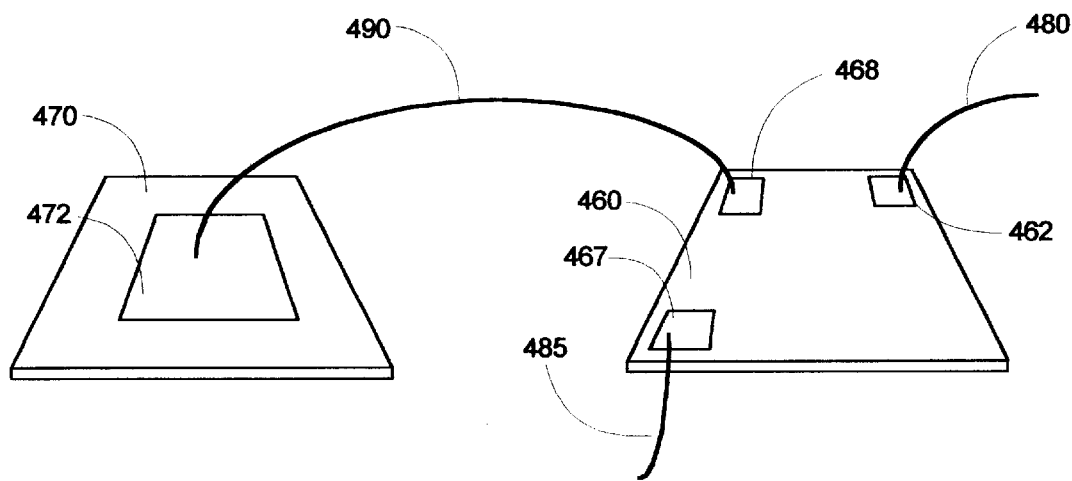
FIGS. 5A and 5B show a perspective view and a blown-up view of a two-lead embodiment of the LED lamp package.

Referring to FIG. 5A, the LED driver chip 460 includes a voltage supply pad 462 connected to the voltage supply terminal of the LED driver 220, an output pad 468 connected to the anode output 210 of the LED driver 220 and a control input pad 467 connected to the control input 215 of the LED driver 220. The LED chip 470 includes an anode pad 472 connected to the anode of the LED 205. Note that the circuitry of the LED driver 220 and the LED 205 are not shown in FIG. 4B. This is done for ease of illustration. In addition, the packaging methods of the invention are not limited by the particular circuits used to implement the LED driver 220 and the LED 205.

The LED lamp package further includes a first bond wire 480 connecting the voltage supply lead 430 to the LED driver chip 460. One end of the first bond wire 480 is connected to the voltage supply lead 430. The other end of the first bond wire 480 is preferably connected to the voltage supply pad 462 on the LED driver chip 460. The LED package also includes a second bond wire 485 connecting the input lead 420 to the LED driver chip 460. One end of the second bond wire 485 is connected to the input lead 420. The other end of the second bond wire 485 is connected to the control input pad 467 on the LED driver chip 460. The LED package further includes a third bond wire 490 connected between the LED driver chip 460 and the LED chip. One end of the third bond wire 490 is connected to the output pad 468 on the LED driver chip 460. The other end of the third bond wire 490 is connected to the anode pad 472 on the LED chip 470.

Preferably, a light shield (not shown) is provided for shielding the LED driver circuit 220 on the LED driver chip 460 from light emitted by the LED 205 on the LED chip 470. The light shield may be provided, for example, by coating an opaque epoxy over the LED driver circuit 220 on the LED driver chip 460. Alternatively, the light shield may be provided by depositing a metal layer over the LED driver circuit 220 on the LED driver chip 460. The metal layer may also function as a metal-interconnect layer for the LED driver chip 460.

The top portions of the three leads 410, 420, 430 are enclosed by a light transparent encapsulant 495. The encapsulant 495 is used to provide mechanical support for the leads 410, 420, 430 to hold them in place. The encapsulant 495 may be made of a diffused or an undiffused epoxy, depending on a desired output radiation pattern. The encapsulant 495 may be formed by placing the top portions of the leads 410, 420, 430 into a dome-shaped mold and injecting a light transparent epoxy into the mold. Although the encapsulant 495 is shown having a hemispherical-domed shape, those skilled in the art will appreciate that the encapsulant 495 can have various other shapes depending on the desired output radiation pattern of the LED lamp package, including a rectangular shape.

Thus, the LED lamp package according to the invention packages the LED chip 470 and the LED driver chip 460 together. This allows, among other things, for a systems manufacturer to conveniently plug the LED lamp package into a system for lighting applications without having to provide a separate LED driver circuit to drive the LED in the LED lamp package.

Figure 5B:
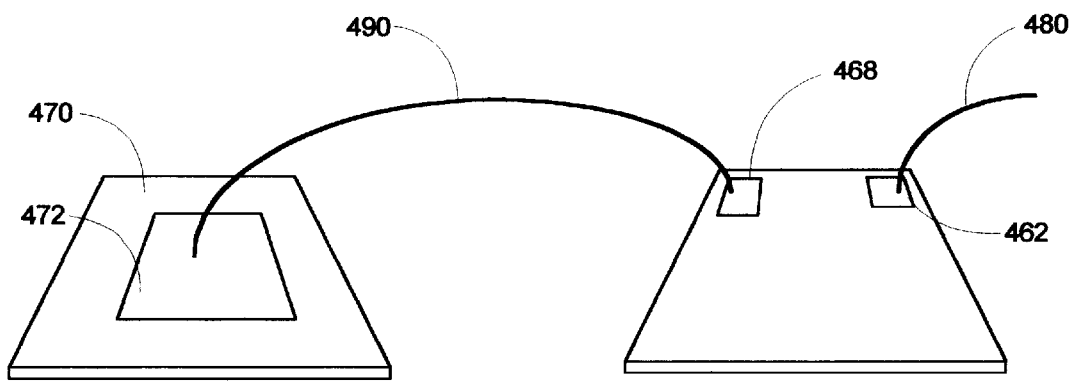

FIGS. 5A and 5B shows a perspective view and a blown-up view, respectively, of a two-lead embodiment of the LED lamp package of FIGS. 4A and 4B suitable for packaging the LED driver 220 and the LED 205 connected in the configuration shown in FIG. 3A. In this embodiment, the LED lamp package does not include the control input lead 420, and the LED driver circuit 220 on the LED driver chip 460 is configured to automatically switch on the LED 205 on the LED chip 470 when a sufficient voltage is applied to the voltage supply lead 430. An advantage of the LED package according this embodiment is that it requires only two leads, namely the ground lead 410 and the voltage supply lead 430.

Figure 6A:
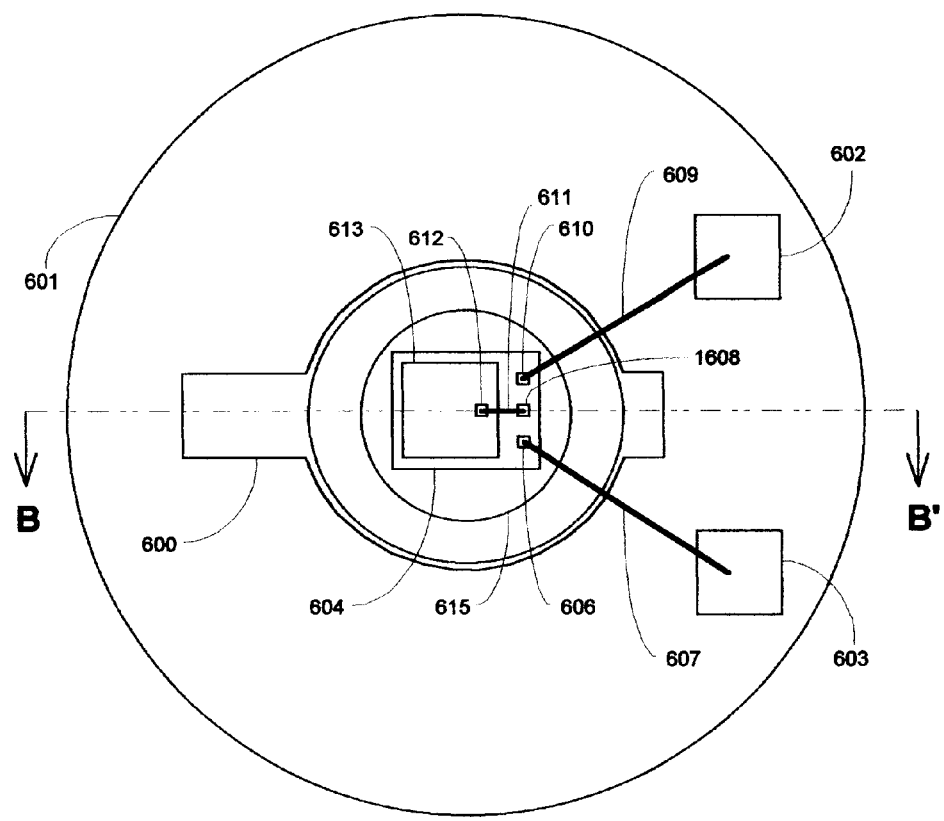
FIGS. 6A and 6B show a top view and a cross-sectional view of an LED lamp package according to another embodiment of the present invention, in which the LED chip is mounted on top of the LED driver chip.
Figure 6B:
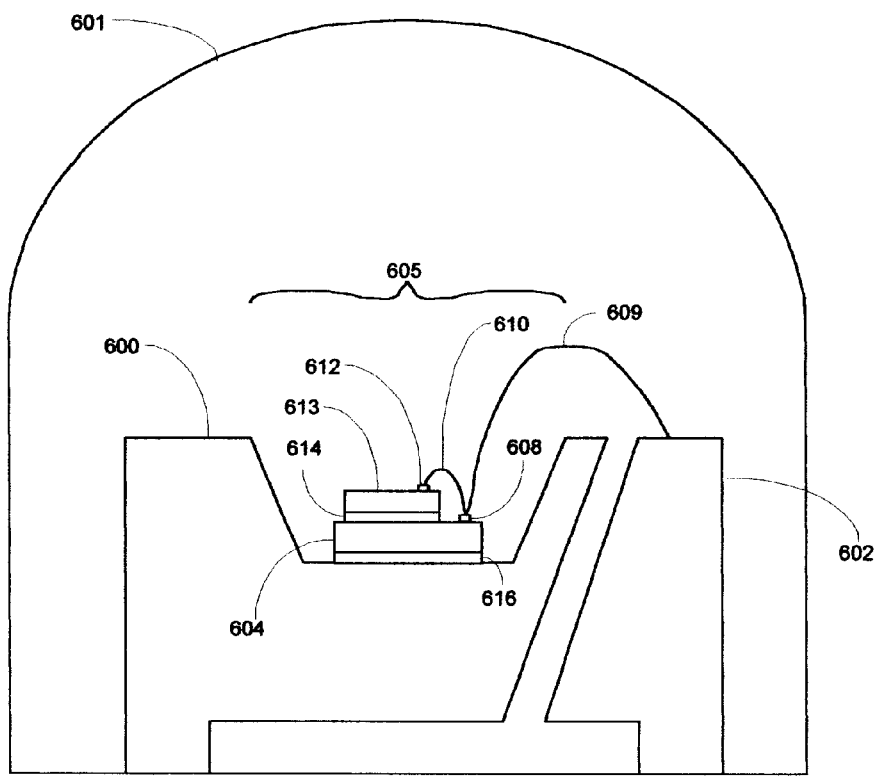

FIGS. 6A and 6B show a top view and a cross section view, respectively, of an LED lamp package according to another embodiment of the present invention. The LED lamp package includes a ground lead 600, a control input lead 602, and a voltage supply lead 603. The leads may be made of metal, such as aluminum. The ground lead 600 includes a reflector dish 615, which may be pressed into the ground lead 600. The lamp package according to this embodiment is suitable for packaging the LED driver 220 and the LED 205 connected in any one of the configurations shown in FIGS. 2A to 2C, as explained further below.

The LED lamp package also includes an LED driver chip 604, on which an LED driver circuit 220 is fabricated, and an LED chip 613, on which an LED 205 is fabricated. The LED driver chip 604 is mounted on the reflector dish 605 of the ground lead 600, and the LED chip 613 is mounted on top of the LED driver chip 604. The substrate of the LED driver chip 604 is electrically coupled to the ground lead 600 to provide a ground connection for the LED driver 220. This may be done, for example, by affixing the bottom surface of the LED driver chip 604 to the reflector dish 605 of the ground lead 600 with an electrically conductive paste 616, such as a silver paste or a conductive epoxy.

Referring to FIG. 6A, the LED driver chip 604 includes a voltage supply pad 606 connected to the voltage supply terminal of the LED driver 220, a first pad 608, and a control input pad 610 connected to the control input 215 of the LED driver 220. The LED chip 613 includes a second pad 612 connected to either the anode or cathode of the LED 205, as explained further below.

The LED lamp package further includes a first bond wire 607 connecting the voltage supply lead 603 to the LED driver chip 604. One end of the first bond wire 607 is connected to the voltage supply lead 603. The other end of the first bond wire 607 is preferably connected to a supply voltage pad 606 on the LED driver chip 604. The LED package also includes a second bond wire 609 connecting the input lead 602 to the LED driver chip 604. One end of the second bond wire 609 is connected to the input lead 602. The other end of the second bond wire 609 is connected to the control input pad 610 on the LED driver chip 604. The LED package further includes a third bond wire 611 connected between the LED driver chip 604 and the LED chip 613. One end of the third bond wire 611 is connected to the first pad 608 on the LED driver chip 604. The other end of the third bond wire 611 is connected to the second pad 612 on the LED chip 613.

Figure 7:
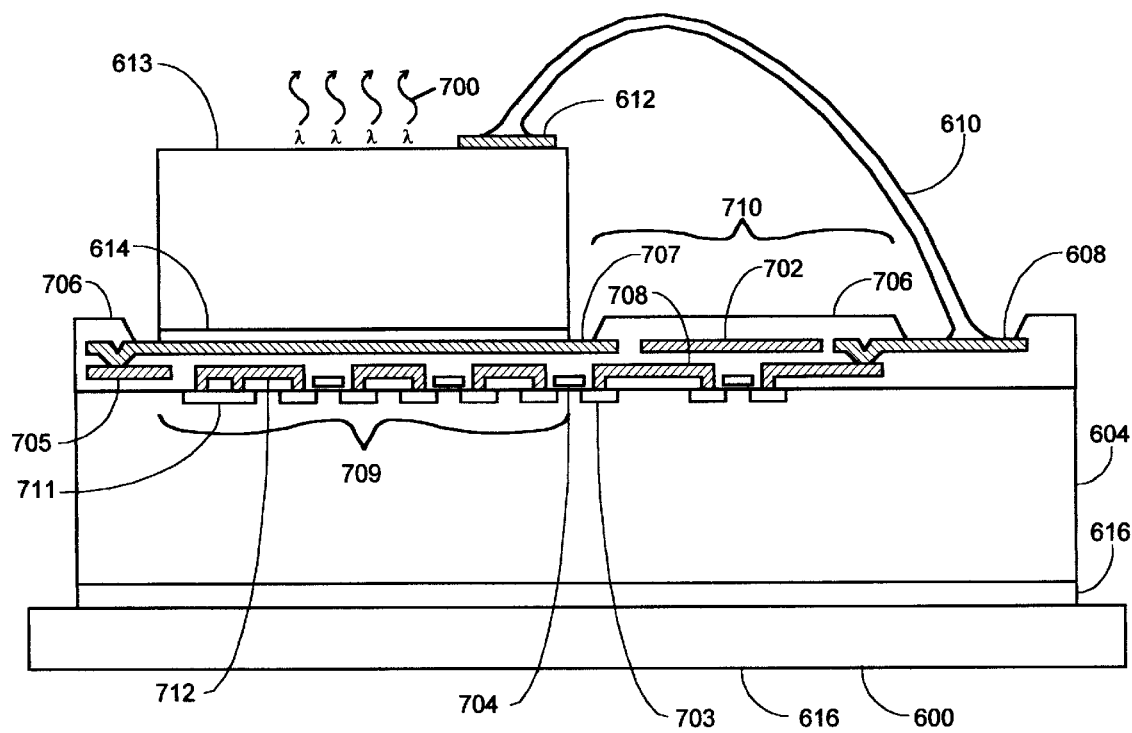
FIG. 7 shows a detailed cross-sectional view of the LED chip mounted on top of the LED driver chip.

FIG. 7 shows a more detailed cross-sectional view of the LED chip 613 and the LED driver chip 604. The cross-sectional view is taken along line segment B–B' of FIG. 6A. In the example shown, the LED driver chip 604 has two metal layers. The top metal layer is used to form the pads of the LED driver chip 604, including an LED chip attachment pad 707 and the first pad 608. The bottom metal layer is used to inner connect the circuit elements of the LED driver circuit 220. The bottom surface of the LED chip 613 is attached to the attachment pad 707 with, e.g., an electrically conductive paste 616, such as a silver paste or a conductive epoxy. Although two metal levels are shown, the LED driver chip 604 may include additional metal layers between the top and bottom metal layers.

In the example shown in FIG. 7, the LED driver circuit 220 is implemented using a CMOS process and includes, but is not limited to, diffusion regions 708 in the substrate of the driver chip 604, polysilicon gates 704, and interconnects 708 formed from the bottom metal layer. Other process may be used to fabricate the LED driver chip 220 including a Bipolar or Bi-CMOS process. Preferably, the circuit elements 709 of the LED driver circuit 220 are placed underneath the attachment pad 707 so that the pad 707 can act as a light shield for the circuit elements. Any circuit elements 720 that cannot be placed underneath the attachment pad 707 due to area restrictions can be placed outside 710 the area covered by the attachment pad 707. In this case, a light shield 702 can be formed from the top metal layer to shield these circuit elements 720, as illustrated in FIG. 7. Alternatively, an opaque material can be deposited on the surface of the LED chip 604 to form a light shield, such as an opaque epoxy, dyed photo resist and the like.

Several examples will now be given for packaging the LED driver 220 and the LED 205 connected in the configurations of FIGS. 2A to 2C using the LED lamp package in FIGS. 6A, 6B and 7.

In a first example, the LED driver 220 is connected to the LED 205 in the configuration of FIG. 2A. In addition, the anode of the LED 205 is connected to the second pad 612 and the cathode of the LED 205 is connected to the bottom surface of the LED chip 613. In this example, the first pad 608 is connected to the anode output 210 of the LED driver 220. The attachment pad 707 is connected to the ground lead 600 through the substrate of the LED driver chip 604. This may be accomplished by connecting the attachment pad to a substrate tie diffusion (not shown) on the top surface of the LED driver chip 604. Substrate tie diffusions, also known as ground taps, are well known for connecting circuit elements to ground through the substrate of a chip.

In a second example, the LED driver 220 is connected to the LED 205 in the configuration of FIG. 2A. This time, however, the cathode of the LED 205 is connected to the second pad 612 and the anode of the LED 205 is connected to the bottom surface of the LED chip 613. In this example, the attachment pad 707 is connected to the anode output 210 of the LED driver 220. The first pad 608 is connected to the ground lead 600 through the substrate of the LED driver chip 604, e.g., using a substrate tie diffusion.

In a third example, the LED driver 220 is connected to the LED 205 in the configuration of FIG. 2B. In addition, the anode of the LED 205 is connected to the second pad 612 and the cathode of the LED 205 is connected to the bottom surface of the LED chip 613. In this example, the second pad 612 is connected to the voltage supply lead 603 by bonding wire 611 instead of the first pad 608. Alternatively, the second pad 612 may be connected to the voltage supply pad 606 by bonding wire 611 instead of the first pad 608. In still another alternative, the first pad 608 may be connected to the voltage supply of the LED driver 220. The attachment pad 707 is connected to the cathode output 25 of the LED driver circuit 220.

In a fourth example, the LED driver 220 is connected to the LED 205 in the configuration of FIG. 2B. This time, however, the cathode of the LED 205 is connected to the second pad 612 and the anode of the LED 205 is connected to the bottom surface of the LED chip 613. In this example, the first pad 608 is connected to the cathode output 225 of the LED driver circuit 220, and the attachment pad 707 is connected to the voltage supply of the LED driver circuit 220.

In a fifth example, the LED driver 220 is connected to the LED 205 in the configuration of FIG. 2C. In addition, the anode of the LED 205 is connected to the second pad 612 and the cathode of the LED 205 is connected to the bottom surface of the LED chip 613. In this example, the first pad 608 is connected to the anode output 210 of the LED driver circuit 220, and the attachment pad 707 is connected to the cathode output 225 of the LED driver circuit 220.

In a sixth example, the LED driver 220 is connected to the LED 205 in the configuration of FIG. 2C. This time, however, the cathode of the LED 205 is connected to the second pad 612 and the anode of the LED 205 is connected to the bottom surface of the LED chip 613. In this example, the first pad 608 is connected to the cathode output 225 of the LED driver circuit 220, and the attachment pad 707 is connected to the anode output 210 of the LED driver circuit 220.

As demonstrated by the above examples, the LED lamp package according to the invention provides great flexibility in connecting the LED driver 220 to the LED 205.

Referring back to FIGS. 6A and 6B, the top portions of the leads 600, 602, 603 are enclosed by a light transparent encapsulant 601. The encapsulant 601 is used to provide mechanical support for the leads 600, 602, 603 to hold them in place. The encapsulant 601 may be made of a diffused or an undiffused epoxy, depending on a desired output radiation pattern. The encapsulant 601 may be formed by placing the top portions of the leads 600, 602, 603 into a dome-shaped mold and injecting a light transparent epoxy into the mold. Although the encapsulant 601 is shown having a hemispherical-domed shape, those skilled in the art will appreciate that the encapsulant 601 can have various other shapes depending on the desired output radiation pattern of the LED lamp package, including a rectangular shape.

Figure 8:
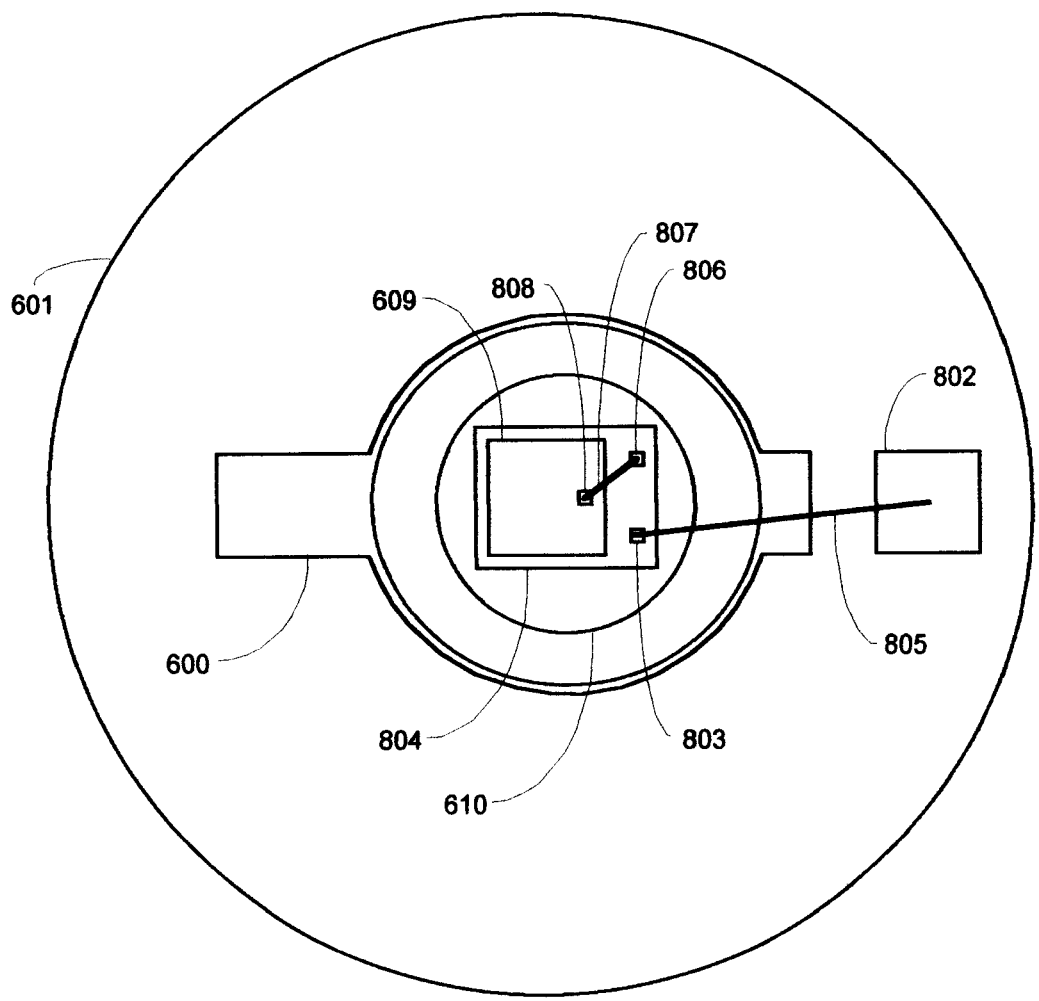
FIG. 8 shows a top view of another two-lead embodiment of the LED lamp package.

FIG. 8 shows a top view of a two-lead embodiment of the LED lamp package in FIGS. 6A, 6B and 7 suitable for packaging the LED driver 220 and the LED 205 connected in the configurations shown in FIGS. 3A to 3B. In this embodiment, the LED lamp package does not include the control input lead 603, and the LED driver circuit 220 on the LED driver chip 604 is configured to automatically switch on the LED 205 on the LED chip 613 when a sufficient voltage is applied to the voltage supply lead 602. An advantage of the LED package according this embodiment is that it requires only two leads, namely the ground lead 600 and the voltage supply lead 602.

Those skilled in the art will appreciate that various adaptations and modifications of the just-described preferred embodiments of the invention can be configured without departing from the scope and spirit of the invention. Therefore, it is to be understood that, within the scope of he appended claims, the invention may be practiced other than as specifically described herein.

What is claimed is:

1. An LED lamp package, comprising:
   a first lead;
   a second lead;
   an LED chip mounted on the first lead, the LED chip comprising an LED;
   an LED driver chip mounted on the first lead and electrically coupled to the second lead, the LED driver chip comprising an LED driver for driving the LED of the LED chip; and
   an encapsulant enclosing the LED chip, the LED driver chip, a portion of the first lead, and a portion of the second lead.

2. The LED lamp package of claim 1, wherein the encapsulant has a hemispherical dome.

3. The LED lamp package of claim 1, wherein the first lead has a reflector dish and the LED chip is mounted on the reflector dish.

4. The LED lamp package of claim 3, wherein the LED driver chip is mounted on the reflector dish.

5. The LED lamp package of claim 1, wherein the LED chip and the LED driver chip are mounted on the first lead by electrically conductive epoxy.

6. The LED lamp package of claim 1, further comprising a third lead electrically coupled to the LED driver chip.

7. The LED lamp package of claim 1, wherein the LED driver chip is electrically coupled to the second lead by a bond wire.

8. An LED lamp package, comprising:
   a first lead;
   a second lead;
   an LED chip comprising an LED;
   an LED driver chip mounted on the first lead and electrically coupled to the second lead, the LED driver chip comprising an LED driver for driving the LED of the LED chip, wherein the LED chip is mounted on the LED driver chip; and
   an encapsulant enclosing the LED chip, the LED driver chip, a portion of the first lead, and a portion of the second lead.

9. The LED lamp package of claim 8, wherein the LED chip is mounted on the LED driver chip by electrically conductive epoxy.

10. The LED lamp package of claim 8, wherein the LED diver chip comprises a pad and the LED chip is mounted on the pad.

11. The LED lamp package of claim 10, wherein the LED chip is mounted on the pad by electrically conductive epoxy.

12. The LED lamp package of claim 8, wherein the encapsulant has a hemispherical dome.

13. The LED lamp package of claim 8, wherein the first lead has a reflector dish and the LED driver chip is mounted on the reflector dish.

14. The LED lamp package of claim 8, further comprising a third lead electrically coupled to the LED driver chip.

15. The LED lamp package of claim 8, wherein the LED driver chip is electrically coupled to the second lead by a bond wire.

* * * * *